United States Patent
Sukegawa et al.

(10) Patent No.: US 10,168,457 B2
(45) Date of Patent: Jan. 1, 2019

(54) MANUFACTURING METHOD OF DIFFRACTION GRATING

(71) Applicant: CANON KABUSHIKI KAISHA, Tokyo (JP)

(72) Inventors: Takashi Sukegawa, Utsunomiya (JP); Shigeru Sugiyama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/590,427

(22) Filed: May 9, 2017

(65) Prior Publication Data

US 2017/0242166 A1   Aug. 24, 2017

Related U.S. Application Data

(62) Division of application No. 13/330,748, filed on Dec. 20, 2011, now Pat. No. 9,678,253.

(30) Foreign Application Priority Data

Dec. 20, 2010   (JP) .................................. 2010-282546
Jul. 7, 2011    (JP) .................................. 2011-151277

(51) Int. Cl.
   *G02B 5/18*    (2006.01)
   *C01B 19/00*   (2006.01)
   *H01L 31/0392* (2006.01)

(52) U.S. Cl.
   CPC .......... *G02B 5/1852* (2013.01); *G02B 5/1857* (2013.01); *G02B 5/1861* (2013.01); *C01B 19/007* (2013.01); *H01L 31/03925* (2013.01)

(58) Field of Classification Search
   CPC .. G02B 5/1861; G02B 5/1857; G02B 5/1852; G02B 27/0172; G02B 5/1842;
   (Continued)

(56) References Cited

U.S. PATENT DOCUMENTS 4,330,175 A * 5/1982 Fujii .................... G02B 5/1857
                                                257/E21.223
4,376,663 A    3/1983 Wang et al.
(Continued)

FOREIGN PATENT DOCUMENTS

JP   55134806 A    10/1980
JP   2003075622 A   3/2003

OTHER PUBLICATIONS

Kuzmenko et al., "High Efficiency Germanium Immersion Gratings", UCRL-CONF-221103, Opto-Mechanical Technologies for Astronomy, Orlando, FL., US, May 5, 2006, pp. 1-16, XP55024985.
(Continued)

*Primary Examiner* — Thomas K Pham
*Assistant Examiner* — Sharrief Broome
(74) *Attorney, Agent, or Firm* — Rossi, Kimms & McDowell LLP

(57) ABSTRACT

A manufacturing method of a Blazed diffraction grating configured to diffract incident light and made of a CdTe or CdZnTe crystal material includes the step of forming a plurality of grating grooves in a processed surface of a work through machining using a processing machine for the Blazed diffraction grating. The forming step forms the grating grooves so that among surfaces of gratings formed by the forming step, a surface that receives the incident light most is set to a (110) plane as a crystal orientation of the crystal material.

4 Claims, 4 Drawing Sheets

(58) Field of Classification Search
CPC .. G02B 5/1866; G02B 5/1809; G02B 5/1814; G02B 5/18; G02B 6/124; G02B 6/34; G02B 27/0081; G02B 27/4205; G02B 1/04

See application file for complete search history.

(56) References Cited

U.S. PATENT DOCUMENTS

| | | | | |
|---|---|---|---|---|
| 4,475,792 | A | * | 10/1984 | Sica, Jr. ............ G02B 5/04 356/305 |
| 2010/0284084 | A1 | * | 11/2010 | Ishibe .................. B23C 3/00 359/571 |

OTHER PUBLICATIONS

McSkimin et al., "Elastic Moduli of Cadmium Telluride", Journal of Applied Physics, vol. 33, No. 1, Jan. 1, 1962, p. 56, XP55024930.
European Search Report issued in European Application No. 11009814.2 dated May 3, 2012.
Shams et al. "Preferential Chemical Etching of Blazed Gratings in (110)-oriented GaAs", Optics Letters, vol. 4, No. 3, Mar. 1, 1979, pp. 96-98, XP055078516, ISSN: 0146-9592, DOI: 10.1364/OL.4. 000096. Cited in NPL 5.
European Search Report issued in European counterpart application No. EP13004129.6 dated Oct. 22, 2013.
Alavudeen et al., "A Textbook of Engineering Materials and Metallurgy", Jun. 30, 2006, pp. 25-36, Laxmi Publications (P) Ltd., New Delhi.
Miller Indices (hkl) obtained from http://www.chem.qmul.ac.uk/surfaces/scc/scat1_1b.htm. Date unknown.
Miller Index obtained from https://en.wikipedia.org/wiki/Miller_index. Date unknown.
Naoto Kobayashi, "Zinc Sulfide and Zinc Selenide Immersion Gratings for Astronomical High-Resolution Spectroscopy: Evaluation of Internal Attenuation of Bulk Materials in the Short Near-Infrared Region", Optical Engineering, vol. 48(8), pp. 084001-1-084001-9, Aug. 2009.
Office Action issued in U.S. Appl. No. 13/330,748 dated Mar. 26, 2015.
Office Action issued in U.S. Appl. No. 13/330,748 dated Jul. 31, 2015.
Advisory Action issued in U.S. Appl. No. 13/330,748 dated Dec. 30, 2015.
Office Action issued in U.S. Appl. No. 13/330,748 dated Feb. 19, 2016.
Office Action issued in U.S. Appl. No. 13/330,748 dated Sep. 8, 2016.
Advisory Action issued in U.S. Appl. No. 13/330,748 dated Dec. 30, 2016.
Notice of Allowance issued in U.S. Appl. No. 13/330,748 dated Feb. 10, 2017.

\* cited by examiner

MANUFACTURING METHOD OF DIFFRACTION GRATING

BACKGROUND OF THE INVENTION

Field of the Invention

The present invention relates to a manufacturing method of a diffraction grating.

Description of the Related Art

An Echelle diffraction grating made of a crystal material is a diffraction grating configured to generate diffracted light of a high order, and machining in a ductility mode is required to form grating grooves for a good optical characteristic. A critical cutout thickness exists in the boundary between the ductility mode and a brittle mode. For example, JP 2003-075622 proposes to form the grating grooves in Si or Ge crystal through superfine cutting using a single crystal diamond tool by setting the processed surface to a (111) plane and a cutting direction to the inside of the (111) plane.

However, no prior art propose machining to form the grating grooves in the Echelle diffraction grating made of a CdTe or CdZnTe crystal material, or a stable ductility mode even when a crystal orientation (crystal plane azimuth) and a critical cutout thickness are set to parameters. When the Echelle diffraction grating is used to as a transmission type (immersion type, backside reflection type), it is easily conceivable that its optical performance is affected by both of the long side and the short side. Nevertheless, in common use, the light incident direction is arranged perpendicularly to the short side of the sectional shape of the grating, and thus the quality of the short side is critical as well as the reflective type.

SUMMARY OF THE INVENTION

The present invention provides a diffraction-grating manufacturing method that can precisely machine grating grooves in a Blazed diffraction grating made of a CdTe or CdZnTe crystal material.

A manufacturing method according to the present invention of a Blazed diffraction grating configured to diffract incident light and made of a CdTe or CdZnTe crystal material includes the step of forming a plurality of grating grooves in a processed surface of a work through machining using a processing machine to form the Blazed diffraction grating. The forming step forms the grating grooves so that among surfaces of gratings formed by the forming step, a surface that receives the incident light most is set to a (110) plane as a crystal orientation of the crystal material.

Further features of the present invention will become apparent from the following description of exemplary embodiments with reference to the attached drawings.

DESCRIPTION OF THE EMBODIMENTS

Figure 1:
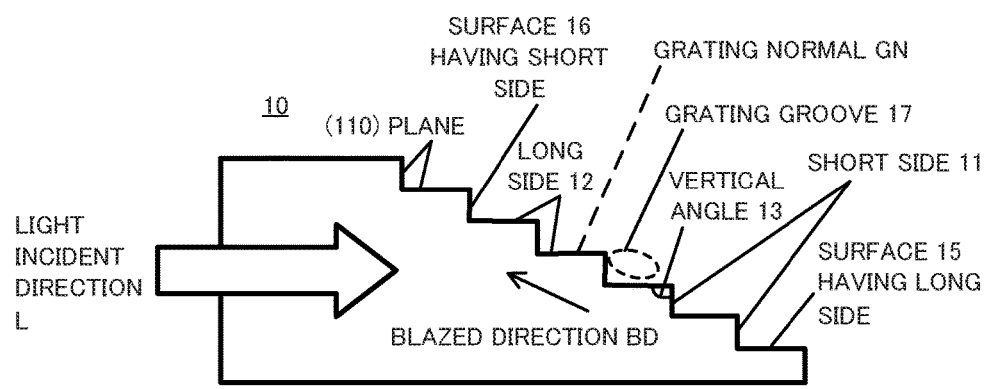
FIG. 1 is a schematic sectional view of a Blazed diffraction grating according to this embodiment.

FIG. 1 is a schematic sectional view of an Echelle (or Blazed) diffraction grating 10 configured to diffract incident light. The Blazed diffraction grating has serrated (Blazed) grating grooves, and has a high diffraction efficiency for a specific order and a wavelength. While the Echelle diffraction grating 10 of this embodiment is an immersed diffraction grating (transmission type diffraction grating) as illustrated in FIG. 1, the Echelle diffraction grating 10 may be configured as a reflection type diffraction grating.

Each grating of the Echelle diffraction grating 10 has an asymmetrical triangular shape that includes a short side 11 and a long side 12 on a section that contains a Blazed direction BD and a grating normal GN perpendicular to the Blazed direction. Each short side 11 and each long side 12 extend in a direction perpendicular to the paper plane of FIG. 1.

An angle θ between the short side 11 and the long side 12 is referred to as a vertical angle 13, and θ is set to 90° in this embodiment. The vertical angle 13 is approximately equal to an opening angle θ1 of the tool's tip which will be described later. Among surfaces of each grating in the Echelle diffraction grating 10 of this embodiment, a surface 16 having a short side 11 serves as a Blazed surface that receives incident light most and a surface 15 having the long side 12 serves as a counter surface adjacent to the Blazed surface. However, in the reflection type Echelle diffraction grating, the surface 15 may be the Blazed surface and the surface 16 may be the counter surface. This embodiment is also applicable even when each grating does not have a triangular section on the section that contains the Blazed direction BD and the grating normal GN perpendicular to the Blazed direction BD.

It is likely that the Echelle diffraction grating 10 is used in such a way that, a light incident direction L is perpendicular to each short side 11, as illustrated in FIG. 1, in order to divide incident light into more light fluxes. The diffraction efficiency depends upon the surface precision (or roughness) of the short side 11. Accordingly, it is demanded that the surface 16 having the short side 11 is highly precisely processed.

Figure 2:
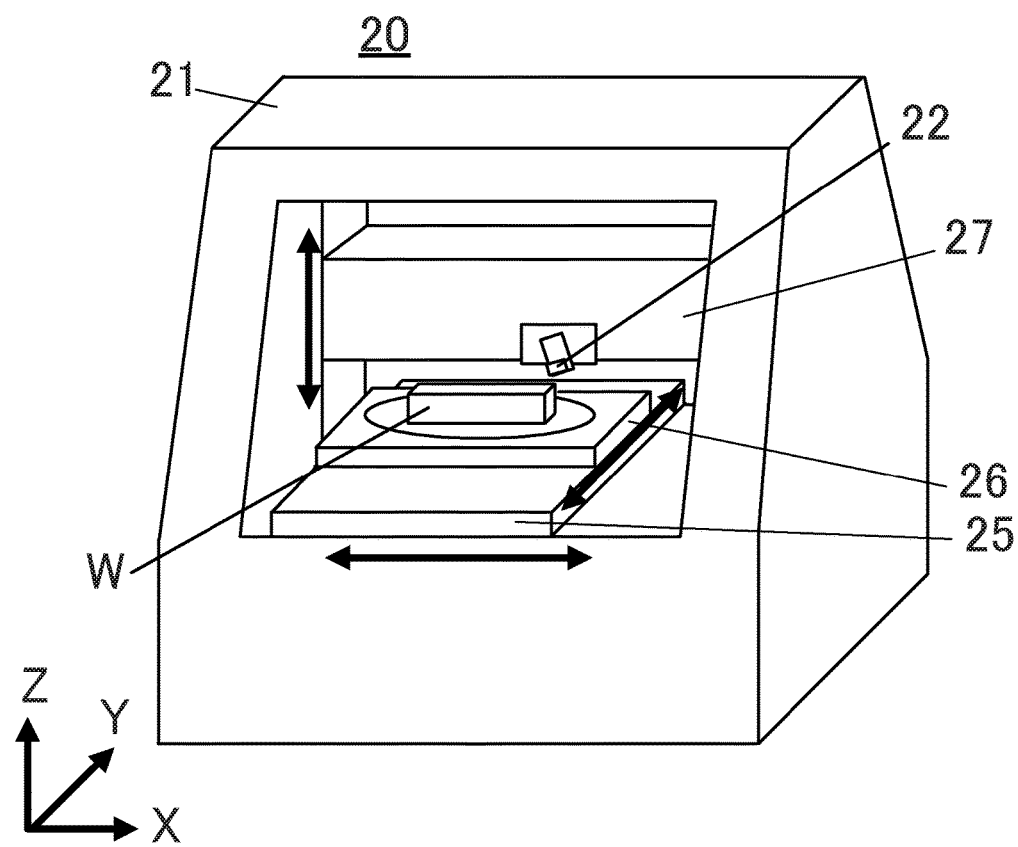
FIG. 2 is a schematic perspective view of a processing machine according to this embodiment.

FIG. 2 is a schematic perspective view of a processing machine 20 according to this embodiment, in which XYZ are set to three orthogonal axes. The processing machine 20 is a manufacturing apparatus configured to manufacture the Echelle diffraction grating 10 by forming a plurality of grating grooves 17 in the work W that is made of a CdTe crystal material (single crystal CdTe) or a CdZnTe crystal material (single crystal CdZnTe).

The processing machine 20 is a superfine cutting machine in which a cutout amount can be designated by numerical control in the order of magnitude of several tens of nanometers. The processing machine 20 utilizes a diamond tool 22 that has a sharp tip for highly precise processing transfer characteristic, and forms the grating grooves 17 in accordance with the Shaper (planing) method that moves the cutting blade and cuts the surface.

The processing machine 20 mounts a work W on an XY stage that includes an X stage 25 that is movable in the X direction and a Y stage 26 that is movable in the Y direction, in a highly rigid housing 21 that is resistant to external vibrations. The diamond tool 22 is installed on a Z stage 27 that is movable in the Z direction. While the diamond tool 22 is not configured to rotate in this embodiment, a processing machine in which the diamond tool 22 is configured to rotate may be used.

Figure 3:
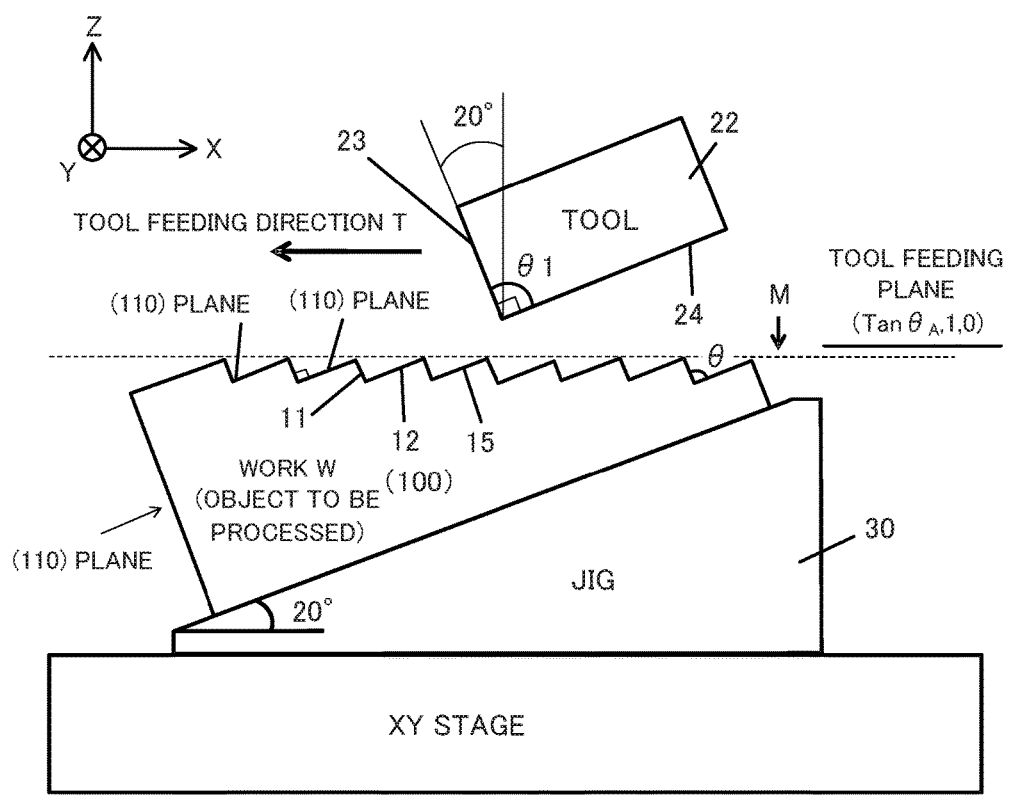
FIG. 3 is a schematic sectional view for explaining a manufacturing method for manufacturing the Blazed diffraction grating illustrated in FIG. 1.

FIG. 3 is a schematic sectional view of the diamond tool 22, and M is a tool feeding plane parallel to both a Blazed direction and a tool feeding direction T in which the diamond tool 22 is moved relative to the work W.

As illustrated in FIG. 3, the diamond tool 22 includes at least two ridgeline cutting blades 23, 24 that transfer a polygonal groove sectional shape that serves as the grating groove 17. The angle θ1 of the tip between the ridgeline cutting blades 23, 24 is approximately equal to the opening angle θ of the grating groove 17, which is 90° in this embodiment. The tip defined by the ridgeline cutting blades 23, 24 is made as sharp as possible, and the linear precision of the ridgeline is very high at the tip. Hence, the wall surface precision of the grating groove of the Echelle diffraction grating 10 can be highly precisely maintained.

From the state where the diamond tool 22 faces the work W, the diamond tool 22 is moved down to the work side by a cutting amount, such as 0.2 µm, in the Z direction, and then the XY stage is linearly or curvedly moved in the X or Y direction. The work W is cut by the ridgeline cutting blades 23, 24 at a cutting speed which is determined by a relative movement between the diamond tool 22 and the work W.

This embodiment is applicable whichever object, i.e., the tool or the work, is moved during the machining. In order to avoid the overload to the tool, the necessary cutting amount in the Z direction may be divided and the step of forming the groove by the divided cutting amount may be repeated several times. During machining, oil mist is jetted from the backside of the tool rake surface so as to remove the processing heat and to smoothly flow out remnants.

Figure 4:
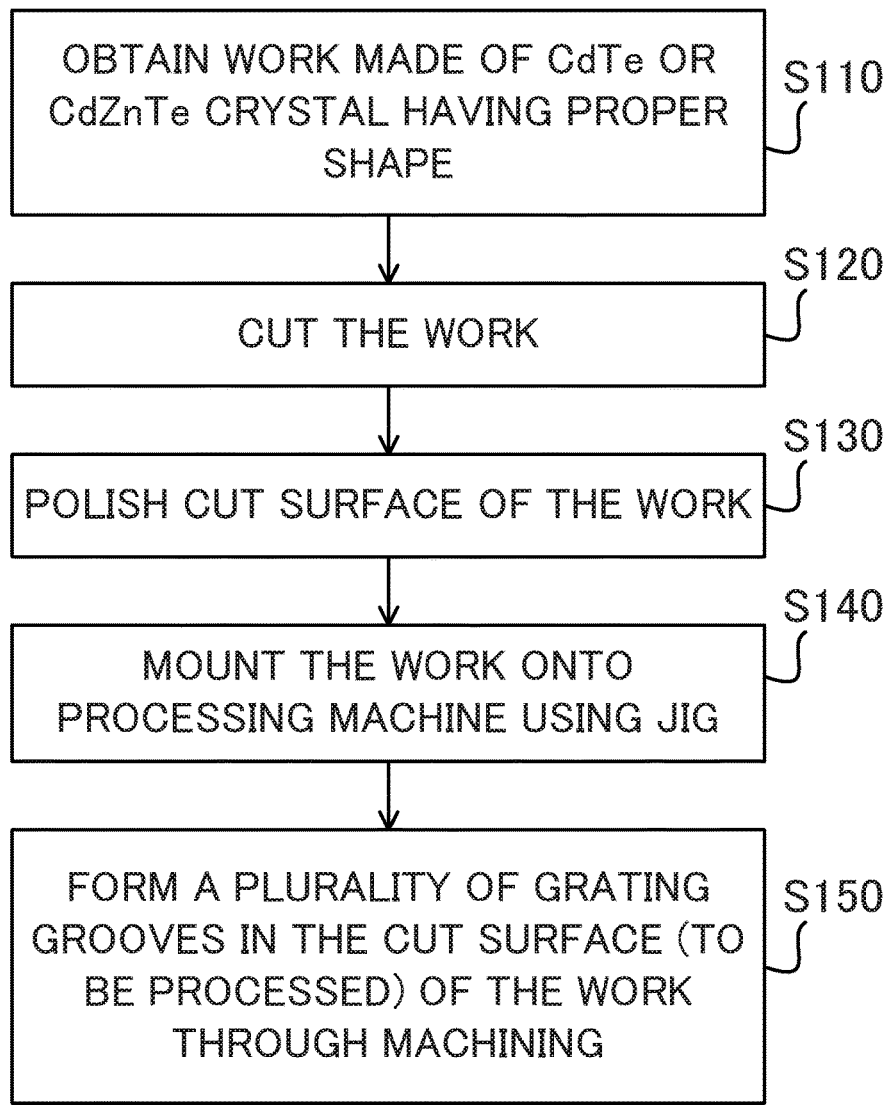
FIG. 4 is a flowchart for explaining a manufacturing method for manufacturing the Blazed diffraction grating illustrated in FIG. 1.

A description will now be given of a manufacturing method of a diffraction grating utilizing the processing machine 20. FIG. 4 is a flowchart for explaining this diffraction-grating manufacturing method (machining) utilizing the processing machine 20, and "S" stands for the "step." FIGS. 5A to 5D are schematic sectional views of the work W in each step of FIG. 4.

Figure 5A:
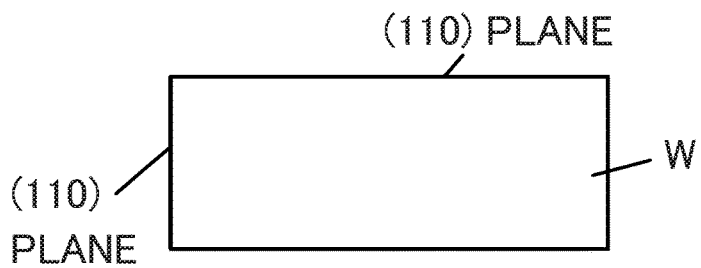
FIGS. 5A-5D are sectional views of a work in each step of FIG. 4.

Initially, as illustrated in FIG. 5A, a work W is obtained from a CdTe or CdZnTe crystal material in an appropriate shape, such as a cylindrical, cubic, or rectangular parallelepiped shape. For example, the cubic work W is obtained utilizing a crystal growth apparatus, etc. (S110). This embodiment obtains a rectangular parallelepiped work W in which both of a top (end) surface and a left (end) surface are crystal-orientation (110) planes.

Figure 5B:
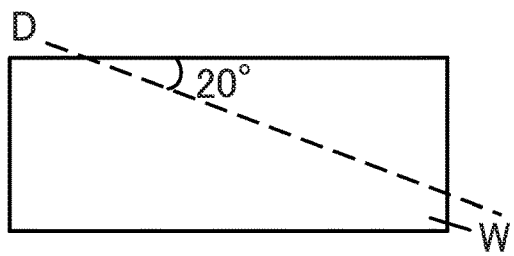

Next, the work W after S110 is cut as illustrated by a dotted line D illustrated in FIG. 5B (S120). This embodiment exemplarily sets a slope angle of the dotted line D to the top surface to 20°. According to this embodiment, the cutting machine used for S120 is not the processing machine 20, and is less precise than the processing machine 20.

Figure 5C:
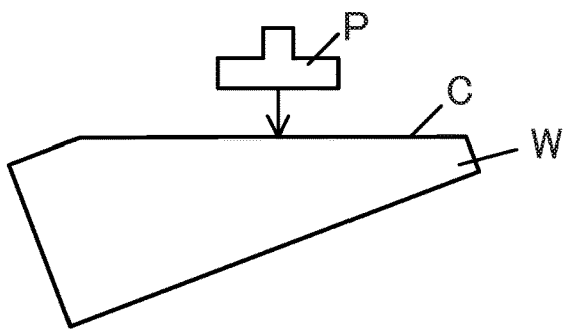

Next, as illustrated in FIG. 5C, the cut surface C of the work W after S120 is polished by a polisher P (S130). In this case, the work W may be installed onto the polisher using a jig 30 that is used for S140.

Figure 5D:
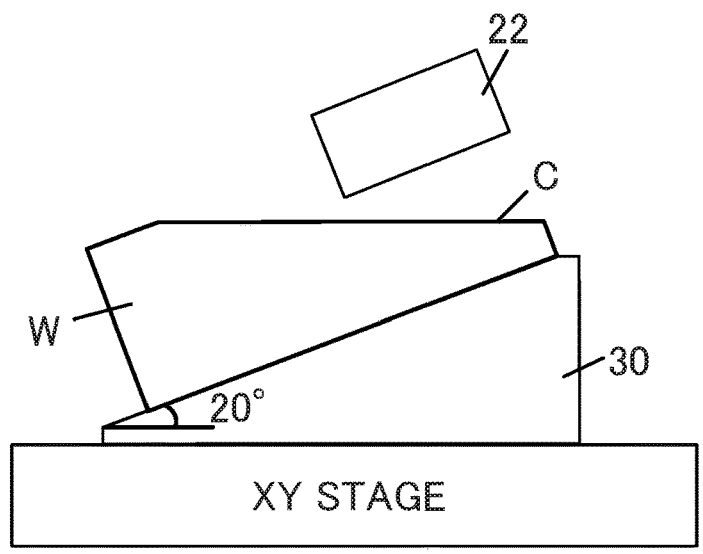

Next, as illustrated in FIG. 5D, the polished work W is installed onto the above XY stage of the machine 20 via the jig 30 (S140). Since the jig 30 has a slope angle of 20°, the cut surface becomes parallel to the surface of the Y stage 26.

The work W is mounted onto the processing machine 20 via the jig 30 so that it inclines by 20° to the tool feeding plane M of the processing machine 20, and the tool 22 is arranged so that the crystal orientation of the tool feeding plane M along which the tool 22 machines the grooves becomes (Tan $\theta_A$, 1, 0) where $\theta_A$=20°. Thus, this embodiment utilizes the Shaper method that translates the diamond tool 22 in the dispersion orthogonal direction (groove direction) on the diffraction-grating groove surface and transfers its shape.

Next follows machining to form the grating grooves in the cut surface C of the work (S150), and the state illustrated in FIG. 3 is obtained. S150 is a step of forming a plurality of grating grooves in the cut surface C as the processed surface. This embodiment selects the crystal orientation such that the surface that has the short side 11 can be the (110) plane and provides processing by a critical cutout thickness or smaller in manufacturing the Echelle diffraction grating using the CdTe or CdZnTe crystal. Thereby, this embodiment can obtain a higher quality diffraction grating than a diffraction grating in which the surface that has the short side 11 is not the (110) plane, because this embodiment can provide excellent processing that keeps the brittle failures to a minimum. When the vertical angle 13 is set to 90°, both of the surface that has the short side 11 and the surface that has the long side 12 can be configured as the (110) planes.

In an example, this embodiment in FIG. 3 provides machining so that the surface 16 having the short side 11 and the surface 15 having the long side 12 are the (110) planes in the Echelle diffraction grating 10 in which an angle is 90° between the short side 11 that constitutes an inclined surface of 20° and the long side 12. When the finished cutout thickness is set to 0.2 µm or smaller, a good optical surface with the surface roughness of 10 nm or smaller is obtained.

On the other hand, when the crystal orientation is not selected in this way, for example, when the surface 16 that has the short side 11 is set to a (111) plane, the surface roughness exceeds 100 nm and the surface precision lowers, even if the finished cutout thickness is set to 0.2 µm or smaller. Conventionally, the crystal orientation of the cut surface of S130 is set to the (111) plane or another plane.

Although it is difficult to obtain perfectly pure crystal due to impurities, the crystal orientation of this embodiment means the crystalline domination and this embodiment is not limited to the state in which all the evaluated crystal orientations are perfectly equal to one another.

When the Echelle diffraction grating 10 is used for a reflection type diffraction grating, it is affected by both of the short side 11 and the long side 12, because the light incident direction is a direction that inclines, by a predetermined angle, to the grating normal perpendicular to the Blazed direction illustrated in FIG. 1. Thus, in that case, machining is performed in such a way that at least one of the short side 11 and the long side 12 can be the (110) plane. Of course, when the vertical angle 13 is 90°, both of the short side 11 and the long side 12 can be set to the (110) plane. While this embodiment utilizes the diamond tool 22 for machining, cutting using a grinder of the (110) plane can keep the surface roughness lower than cutting using the grinder of another crystal orientation plane.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-151277, filed on Jul. 7, 2011 and Japanese Patent Application No. 2010-282546, filed on Dec. 20, 2010, which are hereby incorporated by reference herein in their entirety.

What is claimed is:

1. A manufacturing method of a Blazed diffraction grating configured to diffract incident light and made of a crystal material, the manufacturing method comprising the step of:

forming a plurality of gratings by moving relatively a work and a cutting tool in a groove direction of a plurality of grooves at a plurality of positions in a Blazed direction, wherein each of the plurality of gratings has a triangular section shape on a section that contains the Blazed direction, providing the plurality of gratings, wherein each of the plurality of gratings has a short side surface and a long side surface that intersect each other to constitute one of the plurality of gratings, each of the short side surface and the long side surface extending along the groove direction, which is different from the Blazed direction, wherein the short side surface has a short side of the triangular sectional shape on the section, wherein the long side surface has a long side, which is longer than the short side, of the triangular sectional shape on the section, and wherein one of the short side surface or the long side surface is a (110) plane of the crystal material.

2. The manufacturing method according to claim 1, wherein the short side surface and the long side surface both are the (110) plane of the crystal material.

3. The manufacturing method according to claim 1, wherein the Blazed diffraction grating is made of a CdTe or CdZnTe crystal material.

4. The manufacturing method according to claim 1, wherein the Blazed diffraction grating is an immersed diffraction grating.

* * * * *